(12) United States Patent
Patil et al.

(10) Patent No.: US 10,236,358 B1
(45) Date of Patent: Mar. 19, 2019

(54) INTEGRATION OF GATE STRUCTURES AND SPACERS WITH AIR GAPS

(71) Applicant: GLOBALFOUNDRIES Inc., Grand Cayman (KY)

(72) Inventors: Suraj K. Patil, Chino Hills, CA (US); Jagar Singh, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/784,445

(22) Filed: Oct. 16, 2017

(51) Int. Cl.
| | |
|---|---|
| *H01L 29/49* | (2006.01) |
| *H01L 29/51* | (2006.01) |
| *H01L 29/78* | (2006.01) |
| *H01L 29/417* | (2006.01) |
| *H01L 29/66* | (2006.01) |
| *H01L 21/28* | (2006.01) |
| *H01L 29/08* | (2006.01) |
| *H01L 21/311* | (2006.01) |
| *H01L 21/02* | (2006.01) |

(52) U.S. Cl.
CPC .... *H01L 29/4983* (2013.01); *H01L 21/28176* (2013.01); *H01L 29/0847* (2013.01); *H01L 29/41791* (2013.01); *H01L 29/517* (2013.01); *H01L 29/6656* (2013.01); *H01L 29/66545* (2013.01); *H01L 29/66795* (2013.01); *H01L 29/7851* (2013.01); *H01L 21/02126* (2013.01); *H01L 21/31116* (2013.01); *H01L 29/4966* (2013.01)

(58) Field of Classification Search
CPC ........... H01L 29/4983; H01L 21/28176; H01L 29/0847; H01L 29/41791; H01L 29/517; H01L 29/66545; H01L 29/6656; H01L 29/66795; H01L 29/7851; H01L 21/02126; H01L 21/31116; H01L 29/4966
USPC ......... 257/288, 368, 369; 438/151, 197, 199
See application file for complete search history.

(56) References Cited

U.S. PATENT DOCUMENTS

| | | | |
|---|---|---|---|
| 5,736,446 A | * | 4/1998 | Wu ................... H01L 21/2254 257/E21.148 |
| 8,513,707 B2 | | 8/2013 | Herberholz |
| 9,299,603 B2 | | 3/2016 | Tsai et al. |
| 9,892,961 B1 | * | 2/2018 | Cheng ................. H01L 21/0217 |
| 2006/0220152 A1 | * | 10/2006 | Huang ................ H01L 29/4983 257/408 |
| 2017/0323824 A1 | * | 11/2017 | Chang ................ H01L 21/7682 |
| 2018/0096990 A1 | * | 4/2018 | Bi ....................... H01L 29/0649 |

* cited by examiner

*Primary Examiner* — Shahed Ahmed
(74) *Attorney, Agent, or Firm* — Thompson Hine LLP; Anthony Canale

(57) ABSTRACT

Structures for a field-effect transistor and methods for forming a field-effect transistor. The structure includes a gate structure having a sidewall and a sidewall spacer arranged adjacent to the sidewall of the gate structure. The sidewall spacer includes an energy removal film material and one or more air gaps in the energy removal film material.

20 Claims, 6 Drawing Sheets

INTEGRATION OF GATE STRUCTURES AND SPACERS WITH AIR GAPS

BACKGROUND

The present invention relates to semiconductor device fabrication and integrated circuits and, more specifically, to structures for a field-effect transistor and methods for forming a field-effect transistor.

Device structures for a field-effect transistor include a source, a drain, a channel region of semiconductor material arranged between the source and drain, and a gate structure including a gate electrode and a gate dielectric separating the gate electrode from the channel region. A gate voltage applied to the gate electrode is used to provide switching that selectively connects the source and drain to each other through the channel region.

A fin-type field-effect transistor (FinFET) is a non-planar device structure that may be more densely packed in an integrated circuit than planar field-effect transistors. A FinFET may include a fin consisting of a solid unitary body of semiconductor material, heavily-doped source/drain regions formed in sections of the body, and a gate electrode that wraps about a channel located in the fin body between the source/drain regions. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and lowered power consumption.

When operating, a parasitic capacitance is inherently established between the conductive materials of the gate electrode and the source/drain regions. This parasitic capacitance may contribute to slower transistor turn-on and power loss. With scaling for advanced nodes, the parasitic capacitance increases in significance in device design.

Improved structures for a field-effect transistor and methods for forming a field-effect transistor are needed.

SUMMARY

In an embodiment of the invention, a structure includes a gate structure having a sidewall and a sidewall spacer arranged adjacent to the sidewall of the gate structure. The sidewall spacer includes an energy removal film material and one or more air gaps in the energy removal film material.

In an embodiment of the invention, a method includes forming a first sidewall spacer adjacent to a sidewall of a gate cavity. The sidewall spacer is comprised of an energy removal film material. The method further includes forming one or more air gaps in the energy removal film material after forming the first sidewall spacer, and forming a functional gate structure in the gate cavity after forming the one or more air gaps.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
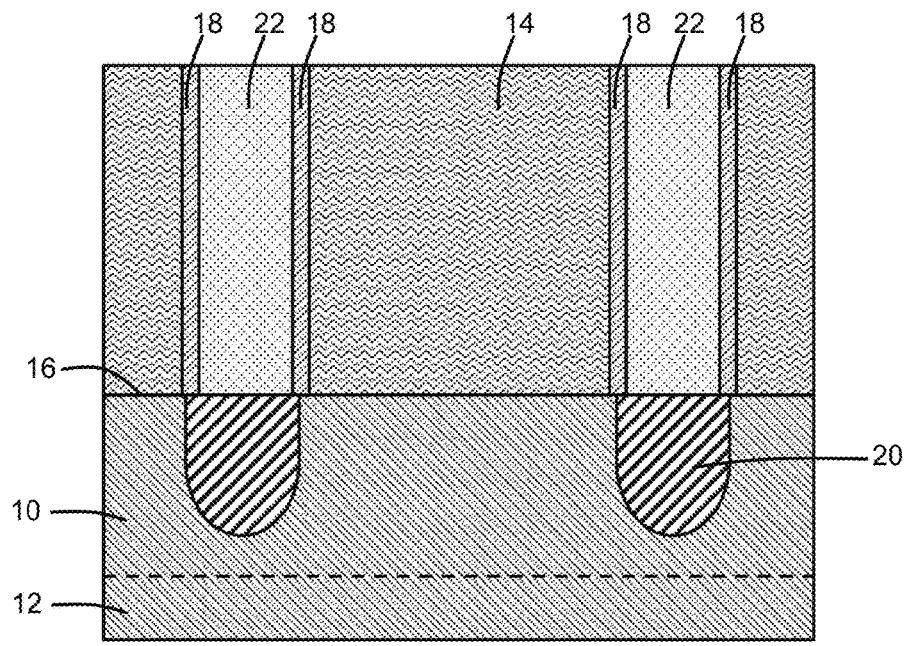
FIGS. 1-11 are cross-sectional views of a portion of a substrate at successive fabrication stages of a processing method in accordance with embodiments of the invention.

With reference to FIG. 1 and in accordance with embodiments of the invention, a fin 10 projects in a vertical direction relative to a substrate 12, such as a bulk single-crystal silicon substrate. The fin 10 is a three-dimensional body composed of a semiconductor material, such as silicon. The seamless transition from the fin 10 to the top surface of the substrate 12 is indicated diagrammatically by the dashed line in FIG. 1. The fin 10 may be formed by patterning the substrate 12 or an epitaxial layer grown on the substrate 12 using a sidewall imaging transfer (SIT) process, self-aligned double patterning (SADP), or self-aligned quadruple patterning (SAQP).

A sacrificial gate structure 14 is arranged on a top surface 16 of the fin 10. The sacrificial gate structure 14 is a placeholder structure for a functional gate structure that is formed in a subsequent processing stage. The sacrificial gate structure 14 may be formed by depositing a blanket layer of a sacrificial material, such as polysilicon, and patterning the blanket layer using an etch mask and an etching process. The sacrificial gate structure 14 is clad by vertical sections of a contact etch stop layer (CESL) 18. The CESL 18 may be constituted by a thin layer composed of silicon nitride ($Si_3N_4$).

Source/drain regions 20 are arranged adjacent to the sacrificial gate structure 14 and the fin 10. As used herein, the term "source/drain region" means a doped region of semiconductor material that can function as either a source or a drain of a field-effect transistor. The source/drain regions 20 may be formed by an epitaxial growth process. For an n-type field-effect transistor, the source/drain regions 20 may be composed of epitaxially-grown semiconductor material doped with an n-type dopant from Group V of the Periodic Table (e.g., phosphorus (P) or arsenic (As)) to provide n-type conductivity. For a p-type field-effect transistor, the source/drain regions 20 may be composed of epitaxially-grown semiconductor material doped with a p-type dopant selected from Group III of the Periodic Table (e.g., boron (B)) to provide p-type conductivity.

An interlayer dielectric layer 22 is formed that covers the source/drain regions 20 and fills the gaps adjacent to the sacrificial gate structure 14. The interlayer dielectric layer 22 may be composed of a dielectric material, such as silicon dioxide ($SiO_2$) deposited by a flowable chemical vapor deposition (FCVD) process and planarized by chemical mechanical polishing (CMP). The planarization may open the top surface of the sacrificial gate structure 14 for removal to define a gate cavity and replacement by a functional gate structure.

Figure 2:
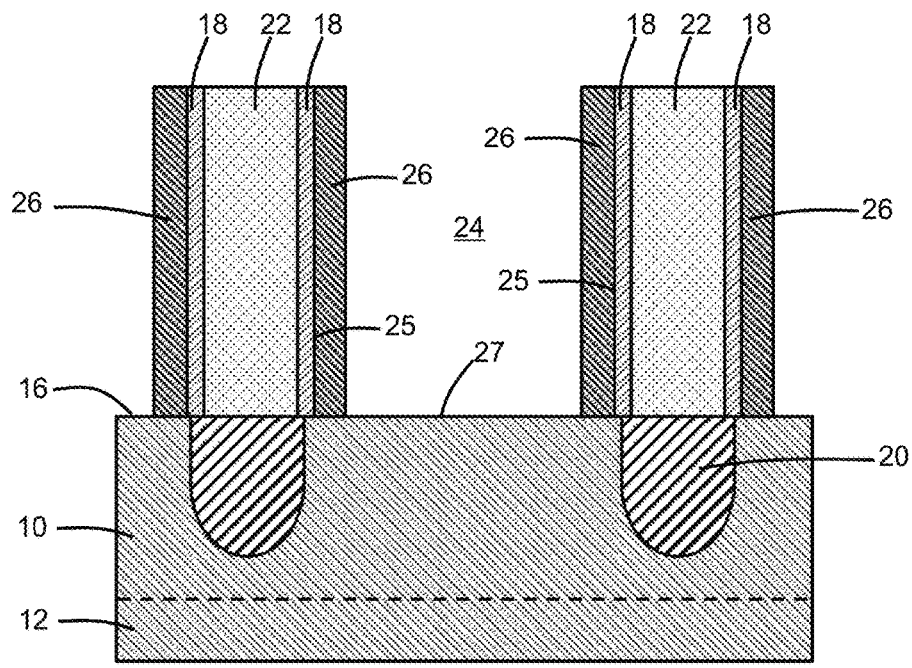

With reference to FIG. 2 in which like reference numerals refer to like features in FIG. 1 and at a subsequent fabrication stage, the sacrificial gate structure 14 is removed with one or more etching processes to define a gate cavity 24 having sidewalls 25 that extend vertically to a base or bottom 27. The top surface of the fin 10 is exposed at the bottom 27 of the gate cavity 24, and the vertical sections of the CESL 18 are exposed along the sidewalls 25 of the gate cavity 24.

Sidewall spacers 26 are subsequently formed adjacent to the vertical sections of the CESL 18 on the top surface of the fin 10 inside the gate cavity 24 respectively adjacent to its sidewalls 25. The sidewall spacers 26 are arranged in direct contact with the top surface of the fin 10 and with the vertical sections of the CESL 18. The sidewall spacers 26 are formed by depositing an energy removal film material and etching the deposited energy removal film material with a directional etching process such as reactive ion etching (RIE). The energy removal film material used to form the sidewall spacers 26 may be an organic compound, such as a silicon-based organic ($C_xH_yO_z$) compound, and may be deposited by chemical vapor deposition (CVD) or a spin-on process. In an embodiment, the energy removal film material constituting the sidewall spacers 26 may be comprised of a sacrificial organic-based material, similar in chemistry and in composition to a porogen, that decomposes into a gaseous form when treated with heat energy and/or electromagnetic radiation.

Figure 3:
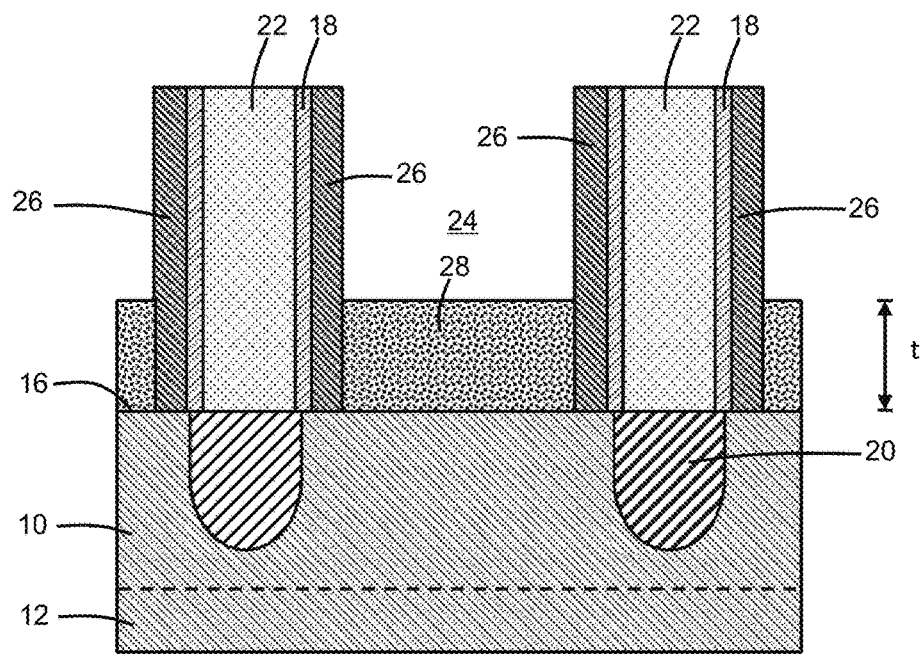

With reference to FIG. 3 in which like reference numerals refer to like features in FIG. 2 and at a subsequent fabrication stage, an etch mask 28 is formed inside the gate cavity 24 on the top surface of the fin 10 between the sidewall spacers 26. The etch mask 28 may be an organic dielectric layer (ODL) or an organic planarization layer (OPL) that is applied by spin-coating and recessed with reactive ion etching to the given thickness relative to the bottom of the gate cavity 24. The etch mask 28 has a given thickness, t, relative to the top surfaces of the fin 10 and substrate 12 that governs a subsequent height reduction of the sidewall spacers 26.

Figure 4:
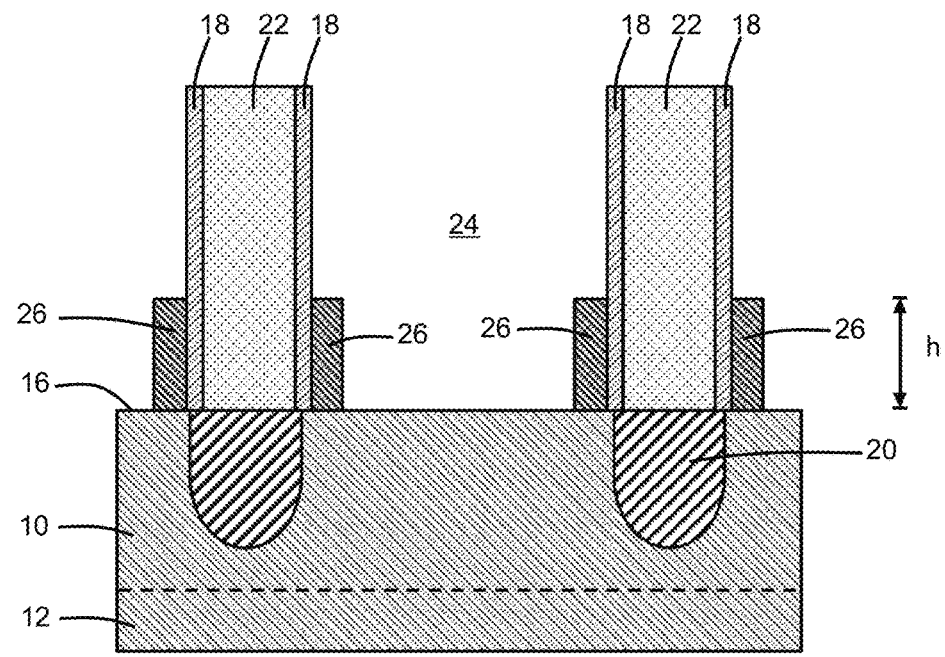

With reference to FIG. 4 in which like reference numerals refer to like features in FIG. 3 and at a subsequent fabrication stage, the sidewall spacers 26 are recessed and chamfered with an etching process that removes sections of the sidewall spacers 26 over a portion of the sidewalls of the gate cavity 24 extending from a plane at the opening to the gate cavity 24 downward to a plane at the top surface of the etch mask 28. The partial removal and pull down of the sidewall spacers 26 reduces their height to be equal to the thickness of the etch mask 28. The height, h, of the sidewall spacers 26 is equal to the thickness, t, of the etch mask 28.

The etching process may rely on an etch chemistry that preferentially removes the energy removal film material of the sidewall spacers 26 selective to the materials of the CESL 18 and interlayer dielectric layer 22 (e.g., silicon nitride and silicon dioxide), and to the material of the etch mask 28. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 5:
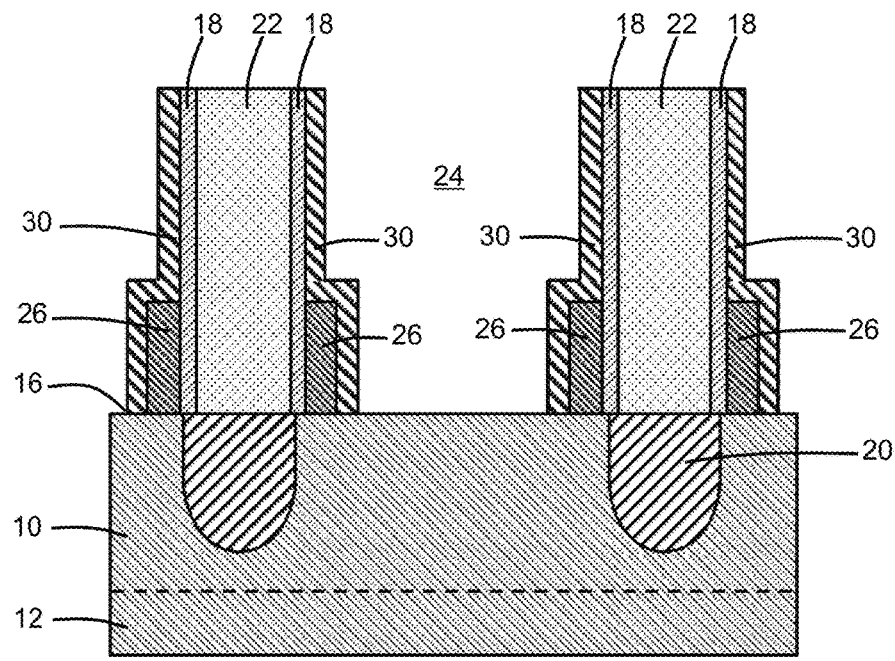

With reference to FIG. 5 in which like reference numerals refer to like features in FIG. 4 and at a subsequent fabrication stage, the etch mask 28 is stripped by, for example, ashing with an oxygen plasma or forming-gas plasma after the sidewall spacers 26 are recessed and chamfered. The removal of the etch mask 28 re-exposes the top surface of the fin 10 at the bottom of the gate cavity 24. Sidewall spacers 30 are formed that extend vertically from the top surface of the fin 10 to the top surface of the interlayer dielectric layer 22 at locations adjacent to the sidewalls of the gate cavity 24. The sidewall spacers 30 may be composed of a dielectric material, such as a low-k dielectric material having a dielectric constant (i.e., permittivity) less than the dielectric constant of silicon dioxide ($SiO_2$). Low-k dielectric materials suitable for the sidewall spacers 30 include, but are not limited to, silicon oxycarbonitride (SiOCN) or silicon boron-doped carbonitride (SiBCN), deposited as a conformal layer by atomic layer deposition (ALD) and etched with a directional etching process such as reactive ion etching (RIE).

The sidewall spacers 30 extend for the full height of the gate cavity 24 relative to the top surface 16 of the fin 10 and cover the recessed sidewall spacers 26 over a portion of the height of the gate cavity 24 such that the sidewall spacers 26 are arranged between the CESL 18 and the sidewall spacers 30. The sidewall spacers 30 are taller than the sidewall spacers 26 measured relative to a reference plane that may be provided by the top surface 16 of the fin 10. The sidewall spacers 30 exhibit a step reflecting the underlying topography of the sidewall spacers 26 that are enclosed by the sidewalls spacers 30.

Figure 6:
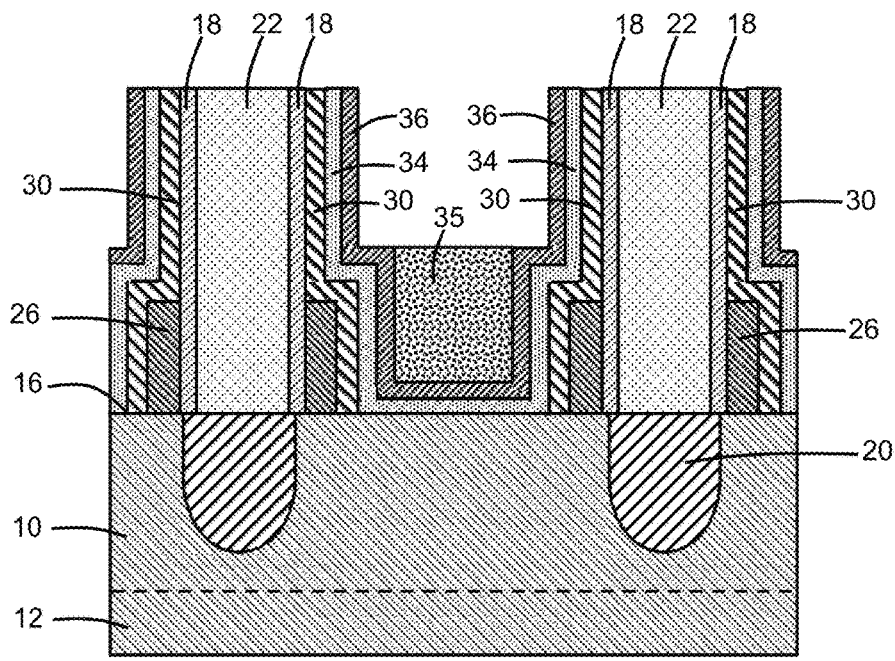

With reference to FIG. 6 in which like reference numerals refer to like features in FIG. 5 and at a subsequent fabrication stage, a gate dielectric layer 34 and a conductor layer 36 may be formed on the sidewall spacers 30 at the sidewalls of the gate cavity 24 and on the top surface of the fin 10 at the bottom of the gate cavity 24. The gate dielectric layer 34 includes vertical sections arranged between the conductor layer 36 and the sidewall spacers 30 at the sidewalls of the gate cavity 24 and a horizontal section arranged between the conductor layer 36 and the top surface of the fin 10 at the bottom of the gate cavity 24. The layers 34, 36 may also extend down the sidewalls of the fin 10 in addition to extending across the top surface of the fin 10 such that the layers 34, 36 wrap about the exterior of the fin 10.

The gate dielectric layer 34 may be composed of a dielectric material, such as a high-k dielectric material having a dielectric constant (i.e., permittivity) greater than the dielectric constant of silicon dioxide ($SiO_2$). High-k dielectric materials suitable for the gate dielectric layer 34 include, but are not limited to, a hafnium-based dielectric material like hafnium oxide ($HfO_2$), a layered stack of a hafnium-based dielectric material and another dielectric material (e.g., aluminum oxide ($Al_2O_3$), zirconium oxide ($ZrO_2$), or lanthanum oxide (LaO)) or combinations of these and other dielectric materials, deposited by atomic layer deposition (ALD). The gate dielectric layer 34 may be constituted by a polycrystalline dielectric material having grains and grain boundaries between grains.

The conductor layer 36 may be composed of a work function metal deposited by physical vapor deposition (PVD) or chemical vapor deposition (CVD). The composition of the work function metal constituting the conductor layer 36 may be selected for forming a gate electrode of either an n-type field-effect transistor or a p-type field-effect transistor. In an embodiment, the conductor layer 36 may be composed of titanium nitride (TiN) used in a gate stack forming a gate electrode of a p-type field-effect transistor, and may be patterned to remove the conductor layer from gate cavities (not shown) in regions used to fabricate n-type field-effect transistors.

The layers 34, 36 are conformally deposited, and then recessed and chamfered using an etching process that removes sections of the layers 34, 36 over a portion of the sidewalls of the gate cavity 24 from a plane at the opening to the gate cavity 24 downward to a plane at the top surface of an etch mask 35. The etch mask 35 may be an organic dielectric layer (ODL) or an organic planarization layer (OPL) that is applied by spin-coating and recessed with reactive ion etching to a given thickness. The etching process may rely on an etching process with one or more etch chemistries that remove the materials of the layers 34, 36 selective to the materials of the fin 10 and the sidewall spacers 30.

Figure 7:
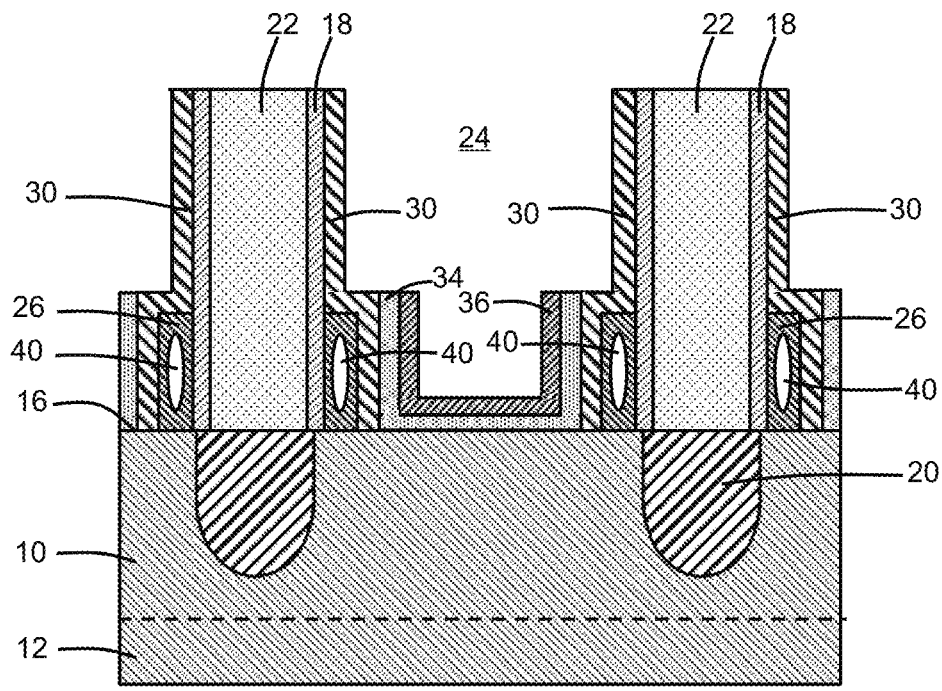

With reference to FIG. 7 in which like reference numerals refer to like features in FIG. 6 and at a subsequent fabrication stage of the processing method, the etch mask 35 is stripped by, for example, ashing with an oxygen plasma or a forming-gas plasma after the sidewall spacers 26 are recessed and chamfered. The gate dielectric layer 34 is subjected to a thermal treatment (i.e., a thermal anneal) in the form of a post-deposition anneal (PDA) with the conductor layer 36 serving as a cap. For example, the PDA may be performed at a temperature in a range of 500° C. to 900° C. for a time sufficient to provide the gate dielectric layer 34 with suitable physical properties. The PDA may oxidize the interface between the gate dielectric layer 34 and the top surface 16 of the fin 10, remove traps, and crystallize polycrystalline dielectric material in the layer 34.

The energy removal film material contained in the sidewall spacers 26 is modified by the thermal treatment in a manner that introduces one or more air gaps 40. In an embodiment, the modification may be a curing of the energy removal film material that decomposes its material to form the one or more air gaps 40. Each air gap 40 may be characterized by a permittivity or dielectric constant of near unity (i.e., vacuum permittivity). Each air gap 40 may be filled by atmospheric air at or near atmospheric pressure, may be filled by another gas (e.g., the gas resulting from the porogen decomposition) at or near atmospheric pressure, or may contain atmospheric air or another gas at a sub-atmospheric pressure (e.g., a partial vacuum). In addition to the thermal treatment, the energy removal film material in the sidewall spacers 26 may be concurrently or intermittently exposed to electromagnetic radiation from an energy source, such as ultraviolet (UV) radiation from a UV energy source.

The modification to the energy removal film material in the sidewall spacers 26 may be a reduction in volume (i.e., shrinkage) upon being heated to a temperature that is greater than ambient temperature and with optional exposure to UV radiation. The shrinkage may be due to a conversion or decomposition of part of the energy removal film to the gaseous state and release of the gaseous products. The one or more air gaps are arranged in the non-converted solid energy removal material constituting a remaining solid portion of the sidewall spacers 26. In an embodiment, the shrinkage in volume of the energy removal film may be on the order of fifty (50) percent, in which instance the one or more air gaps 40 will occupy approximately one-half of the volume of each sidewall spacer 26. In an alternative embodiment, the heat treatment used to form the one or more air gaps 40 may be performed independent of, or in addition to, the process used to thermally treat the gate dielectric layer 34.

Figure 8:
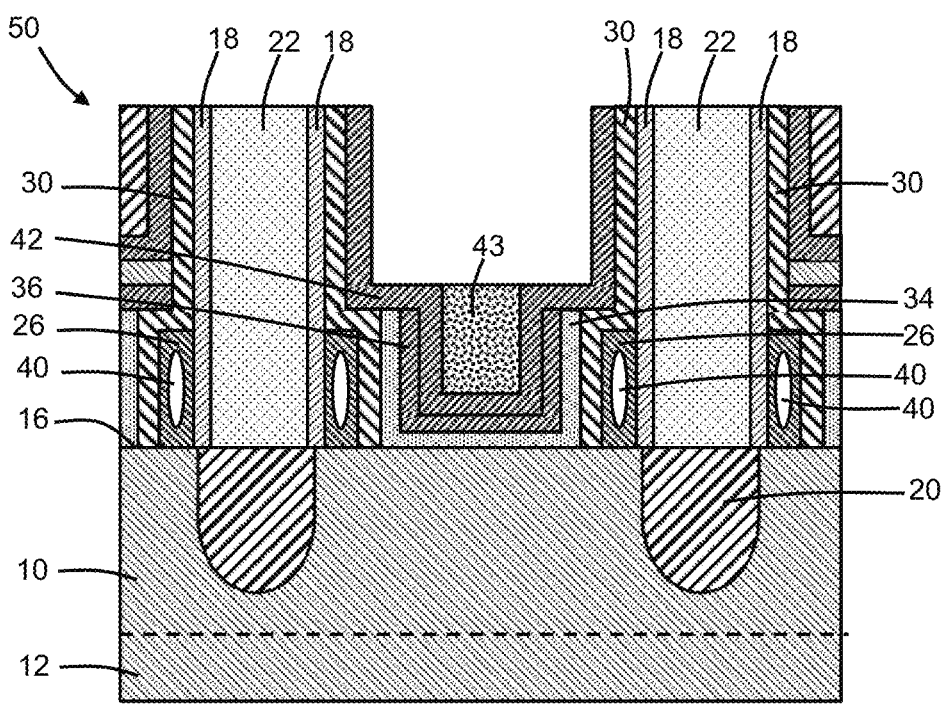

With reference to FIG. 8 in which like reference numerals refer to like features in FIG. 7 and at a subsequent fabrication stage of the processing method, a conductor layer 42 of a functional gate structure is conformally deposited as part of a metal gate stack inside the gate cavity 24 after the sidewall spacers 26 and the gate dielectric layer 34 are subjected to one or more thermal treatments. The conductor layer 42 may be a work function metal layer, such as titanium nitride (TiN) deposited by physical vapor deposition (PVD) or chemical vapor deposition (CVD), used to form a gate electrode of a p-type field-effect transistor. The conductor layer 42 may each be chamfered using an etch mask 43 that is similar to etch mask 35 and an etching process with a suitable etch chemistry. The conductor layer 44 may be chamfered using an etch mask 43 that is similar to etch mask 35 and an etching process with a suitable etch chemistry.

Figure 9:
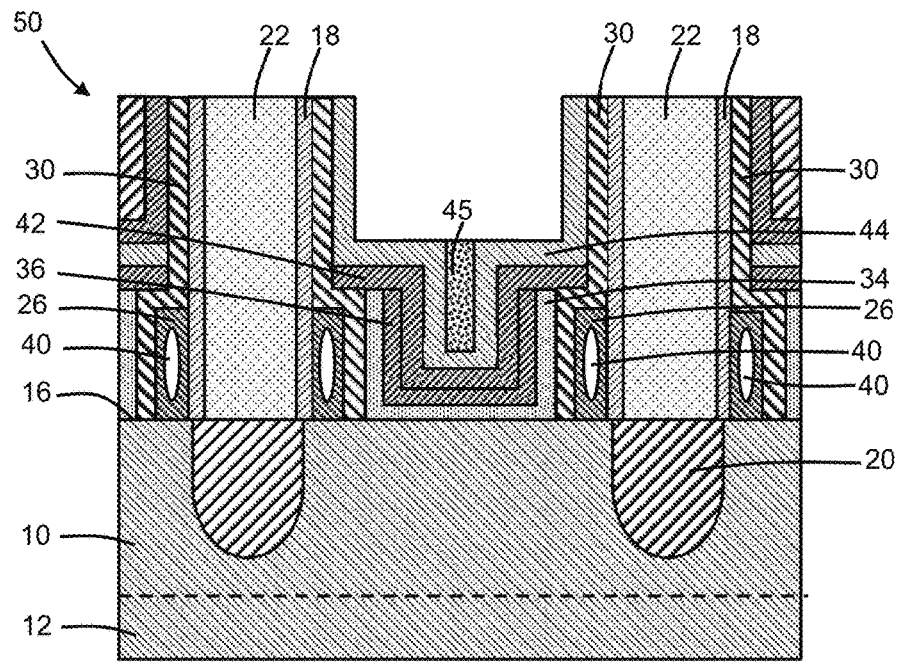

With reference to FIG. 9 in which like reference numerals refer to like features in FIG. 8 and at a subsequent fabrication stage of the processing method, the etch mask 43 is removed, and a conductor layer 44 of the functional gate structure is conformally deposited as part of the metal gate stack inside the gate cavity 24. The conductor layer 44 may be a work function metal layer, such as titanium aluminum carbide (TiAlC) in the formation of a gate electrode of an n-type field-effect transistor. The conductor layer 44 may be chamfered using an etch mask 45 that is similar to etch masks 35, 43 and an etching process with a suitable etch chemistry.

Figure 10:
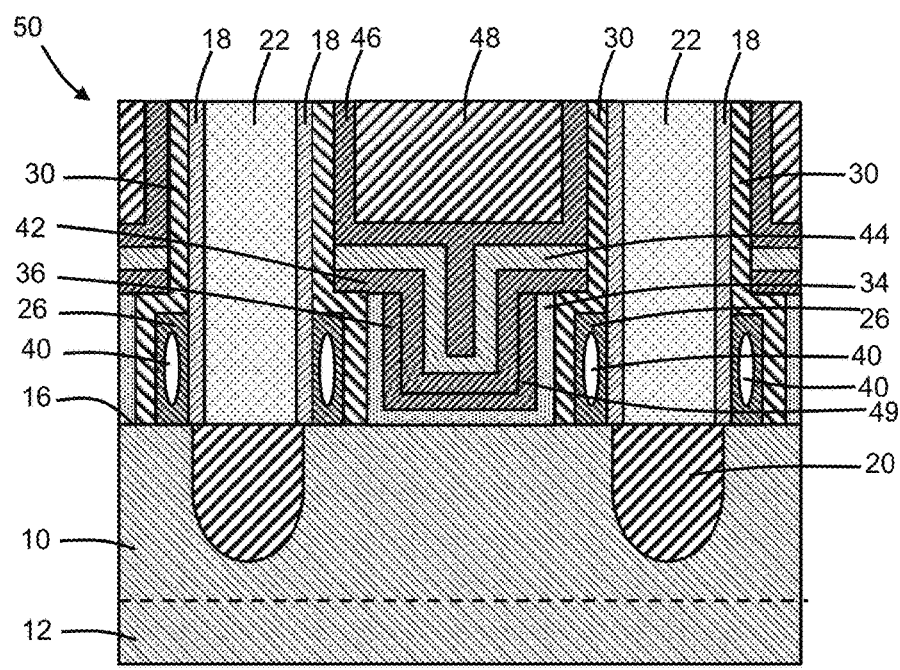

With reference to FIG. 10 in which like reference numerals refer to like features in FIG. 9 and at a subsequent fabrication stage of the processing method, the etch mask 45 is removed, and conductor layers 46, 48 of the functional gate structure are conformally deposited as part of the metal gate stack inside the gate cavity 24. The conductor layer 48 fills the remaining open space inside the gate cavity 24. The conductor layer 46 may be a barrier metal layer, such as titanium nitride (TiN) or fluorine-free tungsten (FFW). The conductor layer 48 may be composed of a conductor, such as tungsten (W) or cobalt (Co) deposited by chemical vapor deposition (CVD). The conductor layers 46, 48 are planarized using a chemical-mechanical polishing (CMP) process to provide a top surface that is coplanar with the top surface of the interlayer dielectric layer 22. In an embodiment, the conductor layers 46, 48 can be further etched back and the opened space filled with dielectric material for gate height control.

The functional gate structure represents a permanent gate structure used to control output current (i.e., flow of carriers in the channel) of a field-effect transistor 50. The functional gate structure has a sidewall, generally indicated by reference numeral 49, extending along the stepped interface with the gate dielectric layer 34.

Figure 10A:
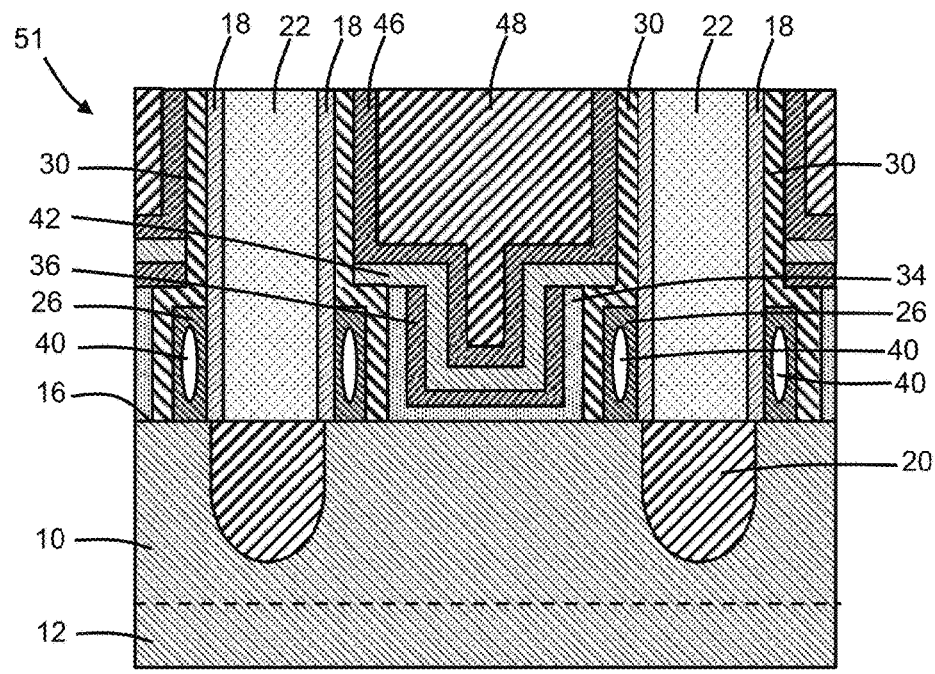
FIG. 10A is a cross-sectional view of the substrate portion similar to FIG. 10 in accordance with alternative embodiments of the invention.

In the representative embodiment, the field-effect transistor 50 is a p-type field-effect transistor in which the functional gate structure includes the work function metal in conductor layer 42 that is characteristic of a p-type field-effect transistor. Alternatively and as shown in FIG. 10A, the device structure may be an n-type field-effect transistor 51 in which the functional gate structure lacks the work function metal in conductor layer 42. In the process flow, the conductor layer 42 is removed from the gate cavities 24 of n-type field-effect transistors 51 before the conductor layer 44 is conformally deposited. In an alternative embodiment that forms both n-type field-effect transistors 51 and p-type field-effect transistors 50, the conductor layer 42 is removed during the process flow when forming the gate stack in the gate cavity 24 associated with each n-type field-effect transistor 51, and may be retained during the process flow when forming the gate stack in the gate cavity 24 associated with each p-type field-effect transistor 50.

Figure 11:
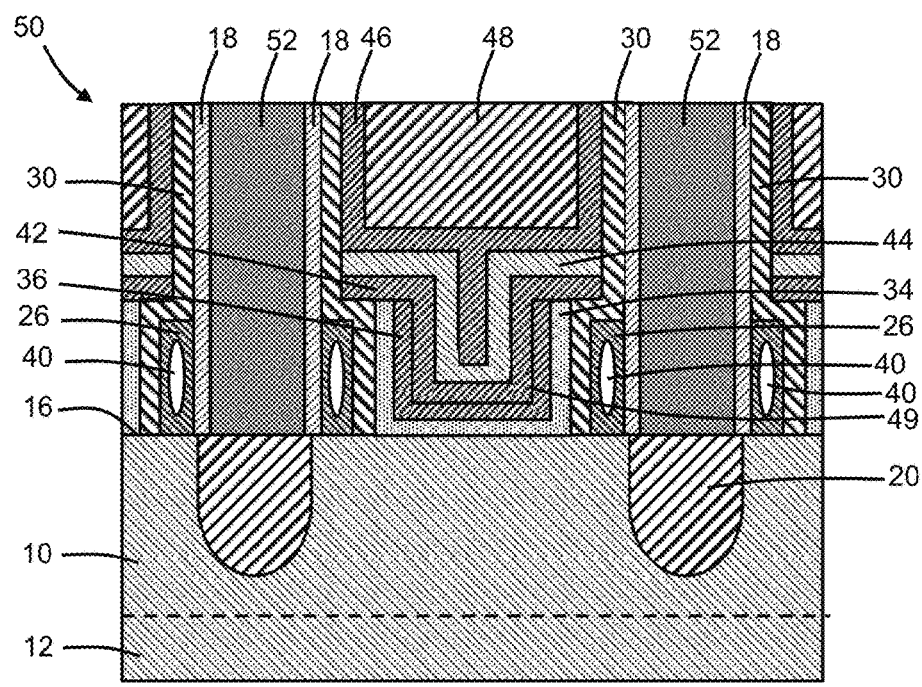

With reference to FIG. 11 in which like reference numerals refer to like features in FIG. 10 and at a subsequent fabrication stage of the processing method, middle-of-line (MOL) and back-end-of-line (BEOL) processing follow, which includes formation of contacts, vias, and wiring for an interconnect structure coupled with the field-effect transistor 50. In particular, the interlayer dielectric layer 22 covering the source/drain regions 20 and the CESL 18 may be removed with etching processes having suitable etch chemistries, and contacts 52 may be formed in the opened spaces that extend vertically to the source/drain regions 20. The contacts 52 may include a metal silicide, such as tungsten silicide ($WSi_2$), titanium silicide ($TiSi_2$), nickel silicide (NiSi), or cobalt silicide ($CoSi_2$), formed by salicidation adjacent to the source/drain regions 20, as well as a conductor, such as tungsten (W), filling the remainder of each space above the source/drain regions 20 opened by the removal of the interlayer dielectric layer 22 and CESL 18. A similar interconnect structure is coupled with the field-effect transistor 51.

The remaining energy removal film material in the sidewall spacers 26, the air gaps 40 embedded in the remaining energy removal film material, and the sidewall spacers 30 will each provide a contribution to the total dielectric constant of the composite spacers and lower the permittivity. The lowering of the permittivity reduces the parasitic capacitance, which may improve the speed of transistor turn-on and reduce power loss during device operation. The permittivity reduction may also improve the maximum frequency of a ring oscillator made from one or more transistors like field-effect transistor 50. The air gaps 40 in the sidewall spacers 26 are arranged between the sidewall spacers 30 and the contacts 52 to the source/drain regions 20. The sidewall spacers 30 are arranged between the air gaps 40 in the sidewall spacers 26 and the functional gate structure.

The sidewall spacers 26 are shorter than the sidewall spacers 30, and the sidewall spacers 30 are formed before the one or more air gaps 40 are formed. The air gaps 40 can only extend vertically to the height of the sidewall spacers 26. The sidewall spacers 26 are surrounded on all sides by the sidewall spacers 30, the fin 10, and the CESL 18. As a result, the one or more air gaps 40 are contained, and the vertical location of the one or more air gaps 40 is controlled.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a gate structure having a sidewall; and
a first sidewall spacer arranged adjacent to the sidewall of the gate structure, the first sidewall spacer including an energy removal film material and one or more air gaps in the energy removal film material.

2. The structure of claim 1 further comprising:
a second sidewall spacer arranged adjacent to the sidewall of the gate structure, the second sidewall spacer positioned between the first sidewall spacer and the sidewall of the gate structure.

3. The structure of claim 2 further comprising:
a gate dielectric layer arranged between the gate structure and the first sidewall spacer, the gate dielectric layer comprised of a high-k dielectric material.

4. The structure of claim 2 wherein the first sidewall spacer has a first height and the second sidewall spacer has a second height relative to a reference plane, and the second height is greater than the first height.

5. The structure of claim 4 further comprising:
a semiconductor fin having a top surface,
wherein the gate structure, the first sidewall spacer, and the second sidewall spacer are arranged on the top surface of the semiconductor fin, and the top surface of the semiconductor fin is the reference plane.

6. The structure of claim 1 further comprising:
a source/drain region; and
a contact extending vertically to the source/drain region, wherein the first sidewall spacer is arranged horizontally between the contact and the sidewall of the gate structure.

7. The structure of claim 6 further comprising:
a second sidewall spacer arranged adjacent to the sidewall of the gate structure, the second sidewall spacer positioned between the first sidewall spacer and the contact, and the second sidewall spacer comprised of a low-k dielectric material.

8. The structure of claim 7 further comprising:
a gate dielectric layer arranged between the gate structure and the first sidewall spacer, the gate dielectric layer comprised of a high-k dielectric material,
wherein the second sidewall spacer is arranged between the first sidewall spacer and the gate dielectric layer.

9. The structure of claim 1 further comprising:
a semiconductor fin having a top surface,
wherein the gate structure and the first sidewall spacer are arranged on the top surface of the semiconductor fin.

10. The structure of claim 9 further comprising:
a second sidewall spacer arranged on the top surface of the semiconductor fin adjacent to the sidewall of the gate structure; and
a contact etch stop layer arranged on the top surface of the semiconductor fin adjacent to the sidewall of the gate structure, wherein the second sidewall spacer, the semiconductor fin, and the contact etch stop layer surround the first sidewall spacer.

11. The structure of claim 1 wherein the gate structure comprises a gate electrode that includes a work function metal layer of a p-type field-effect transistor.

12. The structure of claim 1 wherein the energy removal film material is a solid portion material of the first sidewall spacer, and the one or more air gaps occupy approximately one-half of a volume of the first sidewall spacer.

13. A method comprising:
forming a first sidewall spacer adjacent to a sidewall of a gate cavity, the first sidewall spacer comprised of an energy removal film material;
after forming the first sidewall spacer, forming one or more air gaps in the energy removal film material; and
after forming the one or more air gaps in the energy removal film material, forming a first gate structure in the gate cavity.

14. The method of claim 13 further comprising:
before forming the first sidewall spacer, removing a second gate structure from the gate cavity.

15. The method of claim 13 wherein the first gate structure and the first sidewall spacer are arranged on a top surface of a semiconductor fin, and the first sidewall spacer is arranged between the sidewall of the gate cavity and the first gate structure.

16. The method of claim 13 further comprising:
forming a gate dielectric layer inside the gate cavity,
wherein the first sidewall spacer is arranged between the sidewall of the gate cavity and the gate dielectric layer, and the gate dielectric layer is composed of a high-k dielectric material.

17. The method of claim 16 further comprising:
treating the high-k dielectric material of the gate dielectric layer with a thermal anneal,
wherein the one or more air gaps are formed in the energy removal film material in response to the thermal anneal.

18. The method of claim 13 further comprising:
forming a second sidewall spacer arranged adjacent to the first sidewall spacer,
wherein the second sidewall spacer is positioned between the first sidewall spacer and the first gate structure.

19. The method of claim 13 further comprising:
forming a source/drain region; and
forming a contact extending vertically to the source/drain region,
wherein the first sidewall spacer is arranged horizontally between the contact and the first gate structure.

20. The method of claim 13 wherein forming the one or more air gaps in the energy removal film material comprises:
thermally annealing the energy removal film material.

* * * * *